(12) United States Patent
Olkhovets et al.

(10) Patent No.: US 6,900,575 B2
(45) Date of Patent: May 31, 2005

(54) MULTIPLE MECHANICAL RESONATOR PARAMETRIC DEVICE

(75) Inventors: Anatoli Olkhovets, Murray Hill, NJ (US); Dustin W. Carr, Albuquerque, NM (US); Harold G. Craighead, Ithaca, NY (US); Jeeak M. Parpia, Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 370 days.

(21) Appl. No.: 10/034,594

(22) Filed: Dec. 28, 2001

(65) Prior Publication Data

US 2002/0109494 A1 Aug. 15, 2002

Related U.S. Application Data

(60) Provisional application No. 60/258,667, filed on Dec. 28, 2000.

(51) Int. Cl.$^7$ ................................................ H02N 1/00
(52) U.S. Cl. ...................................................... 310/309
(58) Field of Search .................................. 310/309, 311, 310/316.08, 333; 333/71–76; 318/116, 118

(56) References Cited

U.S. PATENT DOCUMENTS

| | | | | |
|---|---|---|---|---|
| 3,190,129 A | * | 6/1965 | Kritz et al. | 310/321 |
| 3,686,593 A | * | 8/1972 | Zakaria | 310/321 X |
| 4,227,147 A | * | 10/1980 | Miller | 324/72 |
| 5,530,342 A | * | 6/1996 | Murphy | 324/158.1 |
| 5,537,083 A | * | 7/1996 | Lin et al. | 333/186 |
| 5,839,062 A | * | 11/1998 | Nguyen et al. | 455/323 |
| 5,943,464 A | * | 8/1999 | Khodja | 385/122 |
| 6,275,320 B1 | * | 8/2001 | Dhuler et al. | 359/237 |
| 6,308,573 B1 | * | 10/2001 | Lee et al. | 73/652 |

* cited by examiner

Primary Examiner—Mark Budd
(74) Attorney, Agent, or Firm—Schwegman, Lundberg, Woessner & Kluth, P.A.

(57) ABSTRACT

A resonator device utilizes two small mechanical resonators that are electrostatically coupled. A first resonator receives an input signal near its resonant frequency, and the input signal and a second signal are summed and provided to a second resonator. The resonant frequency of the second resonator is approximately equal to the second signal frequency. A width of response of the amplifier is tuned by varying the pump voltage. Resonant frequencies of corresponding individual oscillators are tuned by adjusting bias voltages.

26 Claims, 3 Drawing Sheets

MULTIPLE MECHANICAL RESONATOR PARAMETRIC DEVICE

RELATED APPLICATION

This application claims the benefit of U.S. Provisional Application Ser. No. 60/258,667, filed Dec. 28, 2000, under 35 U.S.C. 119(e).

GOVERNMENT FUNDING

This invention was made with Government support from the National Science Foundation (NSF) under Grant No. DMR-9632275. The Government has certain rights in the invention.

FIELD OF THE INVENTION

The present invention relates to resonator devices, and in particular to a resonator device having multiple mechanical resonators.

BACKGROUND OF THE INVENTION

A conventional amplifier is essentially a variable resistance that uses energy from a direct current (DC) source to increase alternating current (AC) energy. A parametric amplifier uses a nonlinear variable reactance, such as capacitance that varies with time, to supply energy from an AC source to a load. The energy required to vary the capacitance is obtained from an electrical source called a pump. Since reactance does not add thermal noise to a circuit, parametric amplifiers produce less noise than most conventional amplifiers.

Dynamical properties of mechanical resonators can be utilized to create a parametric amplifier. Parametric amplification has long been used as a technique for making a low noise electronic amplifier. The amplification of the applied signal is done by making use of the energy from the pumping action. Parametric amplifiers with a variable-capacitance main-oscillator semiconductor diode are used in radar tracking and communications between Earth stations, satellites, and deep-space stations. The noise temperature of cooled amplifiers is in the range of 20 to 30 K, and the gains are up to 40 dB. This type of amplification is also widely used in optics as well as in electronic traveling wave applications.

Parametric amplification is also observed in micro-mechanical systems. The signal of such a system is obtained by applying the pump voltage at double frequency, making a degenerate amplifier. Similar effects occur in cantilever resonators and torsional resonators. The usefulness of the degenerate amplifier may be limited due to phase sensitivity. It is often undesirable to have an amplifier that requires a specific phase of the signal that is to be amplified.

SUMMARY OF THE INVENTION

A mechanical parametric device is formed using two electrostatically coupled resonators. A first resonator oscillates in response to a signal. A second resonator provides feedback, causing amplification of the oscillation of the first resonator. In further embodiments, the device serves as a frequency up or down converter.

The resonators comprise torsional resonators consisting of a rectangular paddle suspended by narrow beams. The frequency of resonation of each of the resonators is different, and is varied by adjusting dimensions of the paddle and beams, and fine tuned by adjusting a bias voltage. The resonant frequency of the first resonator is tuned to a desired signal to be received. The second resonator is pumped with a signal that is the sum of approximately it's resonant frequency plus the frequency of the received signal. Both resonators are also biased a desired amount.

In one embodiment, the resonators are formed on a silicon substrate using common photo lithographic processing. The resonators are formed on top of an insulator, such as silicon dioxide, and the substrate is grounded. The paddles of the resonators are formed closely adjacent each other to facilitate electrostatic coupling. In one embodiment, the resonators are positioned on top of each other using multilayer lithography to increase coupling.

Mechanical motion of the resonators is detected using optical interferometry. The motion of the paddles modulates reflected laser light. The reflected laser light is detected by an AC-coupled photoreceiver. The frequency of the second resonator is swept near resonance in one embodiment to determine an optimal pumping frequency, and the mechanical response of the first resonator is measured. Peak amplitude and width are measured by fitting a Lorentzian curve to the measured response. In a further embodiment, mechanical motion of the resonators is converted to an electrical signal by capacitive coupling, or piezoelectric devices coupled to the resonators.

In yet a further embodiment, the pump voltage is modified to change the width of the resonator response, resulting in a tunable width filter.

Other mechanical resonators, such as cantilevers double-supported beams, drum-like membranes, torsional and translational paddle resonators, and other geometrical shapes are used in further embodiments and optimized for desired applications.

DETAILED DESCRIPTION OF THE INVENTION

In the following description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

Figure 1:
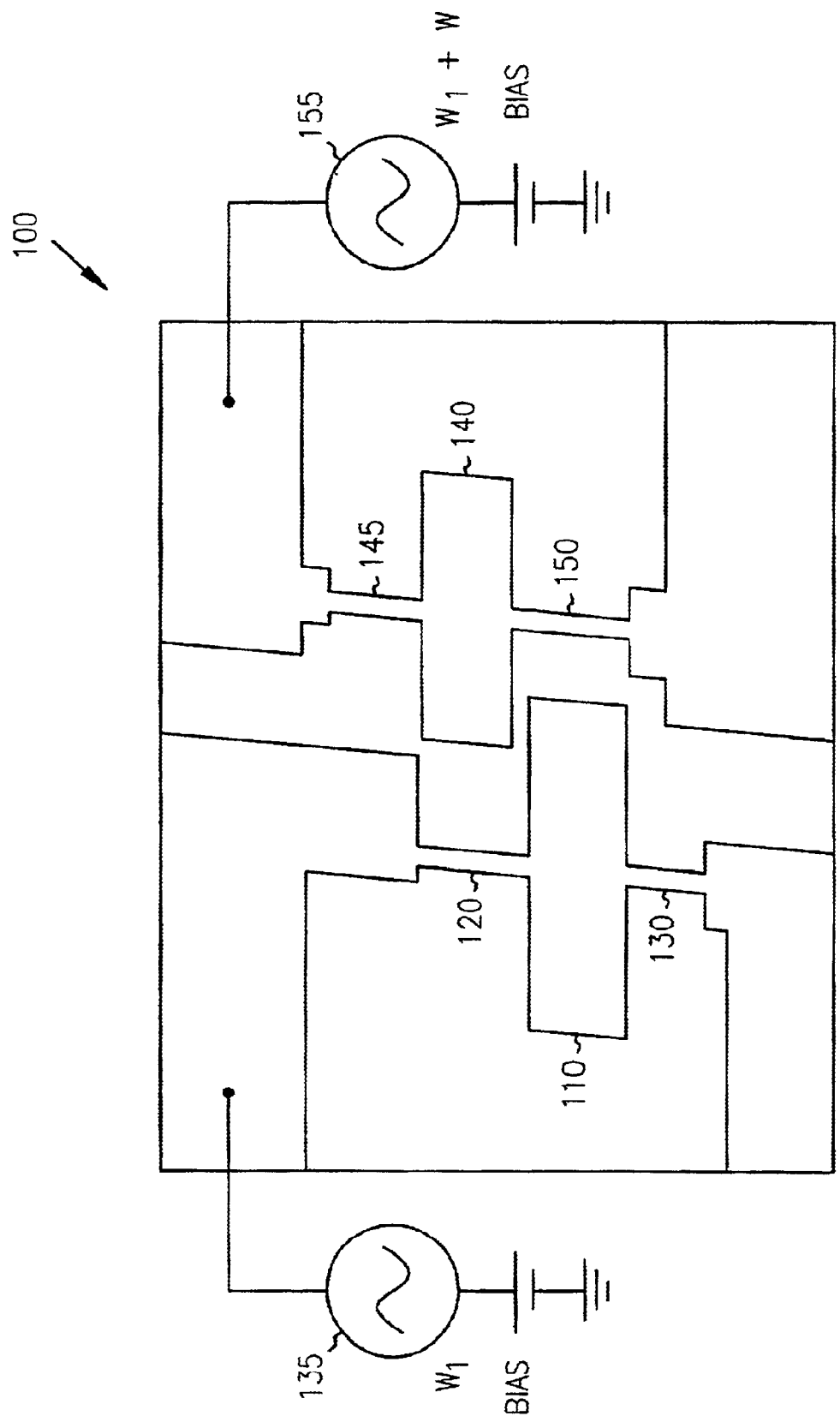
FIG. 1 is a block diagram of a parametric amplifier having electrostatically coupled resonators.

A dual resonator parametric device is shown in block form in FIG. 1 at 100. The device serves as an amplifier or a frequency up or down converter as desired. A first resonator comprises a paddle 110, supported by narrow beams 120 and 130 over a substrate from which they were formed. An AC, signal, $w_1$, to be detected is represented at 135, and is provided by an antenna in one embodiment. The resonant frequency of the first resonator is $f_1$, which is close to the signal, $w_1$, to be amplified. Other sources of AC signal to be detected are also within the scope of the invention.

Coupled with a biasing signal, the AC signal causes oscillation of the first paddle. A second resonator comprises a paddle 140 supported by narrow beams 145 and 150 over the substrate. The resonators are formed using common photolithographic techniques in one embodiment.

The paddles 110 and 140 are formed such that at least a portion of them is adjacent to each other as shown in FIG. 1. As shown, the beams are positioned approximately about the middle of the paddles, and the overlap is between respective beams. The paddles are positioned close enough to ensure electrostatic coupling, such that oscillation of one paddle causes oscillation of the other paddle. Many different embodiments provide such coupling. The second paddle 140 has a different resonant frequency, $f_2$. A second signal, $w_2$, is generated close to $f_2$ for feeding back to the second resonator. A third signal, that is the sum of the first signal, $w_1$, plus the second signal, $w_2$, is provided to the second resonator to cause it to oscillate. The summed signals at 155 and a biasing signal are provided back to the second oscillator as a pump, which oscillates the second paddle, causing amplification of the oscillation of the first paddle. The measured oscillation of the first paddle serves as the output of the parametric amplifier and is representative of the received signal.

In one embodiment, two torsional resonators are positioned in close proximity to each other as in FIG. 1. The resonators consist of a rectangular paddle suspended by narrow beam supports approximately 200 nm in width. The amplitude of the torsional mode is substantially increased by introducing a small asymmetry in the supports. In one embodiment, the paddles have 0.5 um asymmetry (less than 10% of paddle width).

The torsional resonators in one embodiment have resonant frequencies, $f_1$=1.39 MHz and $f_2$=2.66 MHz. These frequencies are varied by adjusting the device dimensions, such as beam size and paddle size. Generally, a smaller paddle size results in a higher resonant frequency. The resonant frequencies of the two paddles may be significantly varied from those identified above. In one embodiment, the resonant frequencies are selected such that they are not a multiple of each other. They are used as a frequency selective filter having a narrow bandwidth in a further embodiment. The narrow bandwidth allows finer subdivision of RF bandwidth by requiring less separation between frequencies used to carry information.

A very small driving voltage is applied to the first resonator, and its mechanical response is observed. Then the pump at the sum of the first and second signals is applied to the second resonator. As the pump is turned on, this voltage is greatly amplified. A small shift in the resonant frequency occurs due to extra DC voltage (which comes from time-averaging of squared AC voltage) being applied to the resonator. The theoretical gain of the amplifier has no limit. However, applying high gains will also amplify thermomechanical noise, and the system will start self-oscillating. In one embodiment, a maximum amplification of $2.1 \times 10^4$ times (or 43 dB) is obtainable, before the system starts self-resonating. A significant increase in the effective quality factor of the resonator reduces phase noise and improves the frequency stability of the system. As in some other amplifiers, the gain has asymptotic behavior. Amplitude-limiting feedback loops are employed in one embodiment to improve stability and allow reliable use of higher gains.

The width of the response of a resonator is tuned by varying the pump voltage. The resonant frequencies of the individual oscillators are slightly tuned by about 5% by adjusting the bias voltages. Qualitatively similar effects occur with devices of other geometries. In general, the closer the resonators are to each other, the smaller the required AC pumping voltage to start parametric amplification. The AC pumping voltage is decreased substantially by positioning the resonators on top of each other using multi-layer lithography. This greatly increases coupling.

Figure 2:
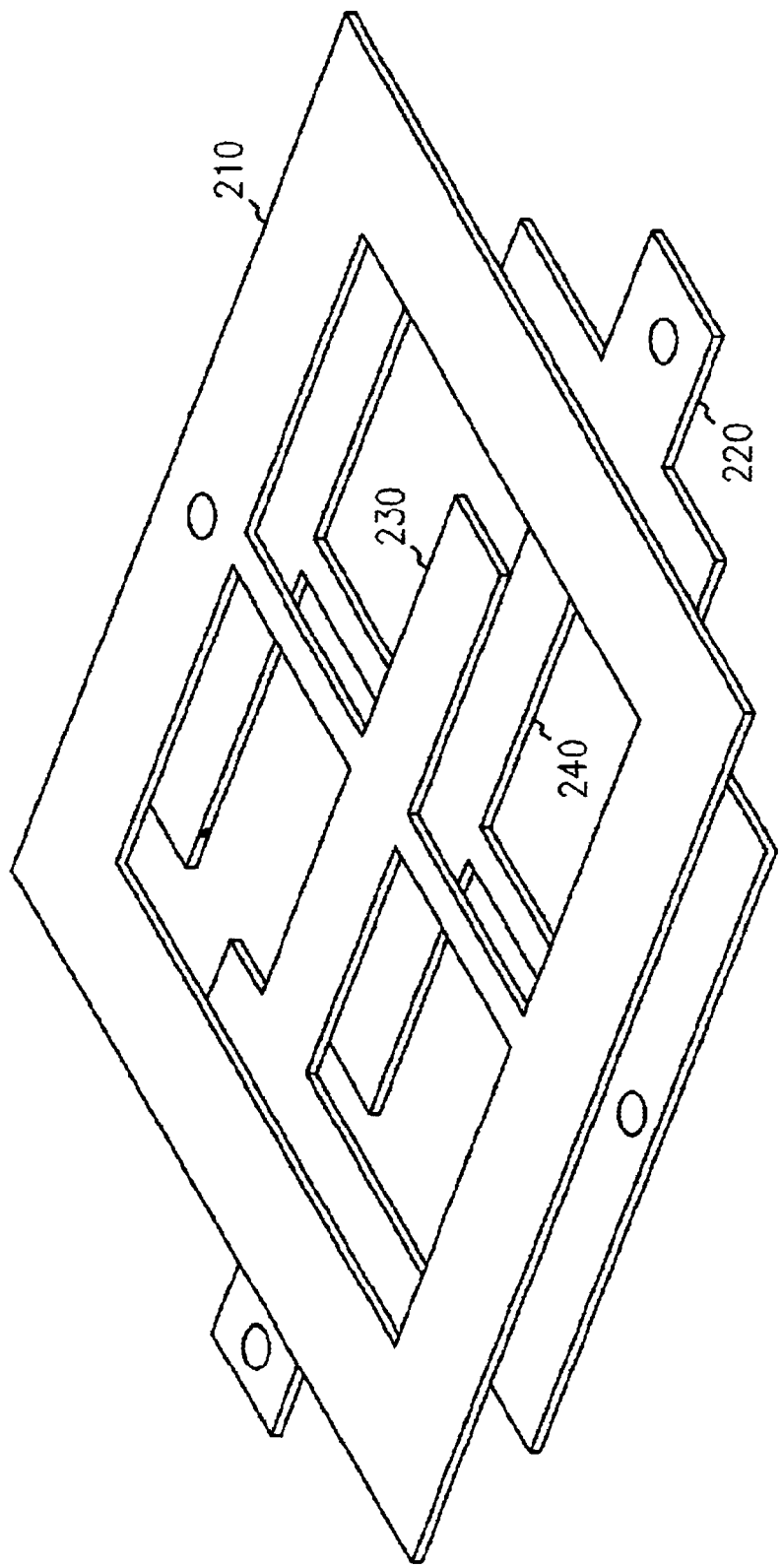
FIG. 2 is a block diagram of an alternative parametric amplifier having electrostatically coupled resonators.

An alternative embodiment of a mechanical parametric amplifier is shown in FIG. 2. A first resonator 210 and a second resonator 220 comprise paddles 230 and 240 respectively, supported by narrow beams above a substrate, to a frame. In this embodiment, the paddles are vertically aligned with each other to provide increased electrostatic coupling. Multidimensional lithography techniques are used to produce such structures. In this embodiment, the pump signal is supplied to the second resonator 220, and the first resonator 210 is provided the received signal.

Figure 3:
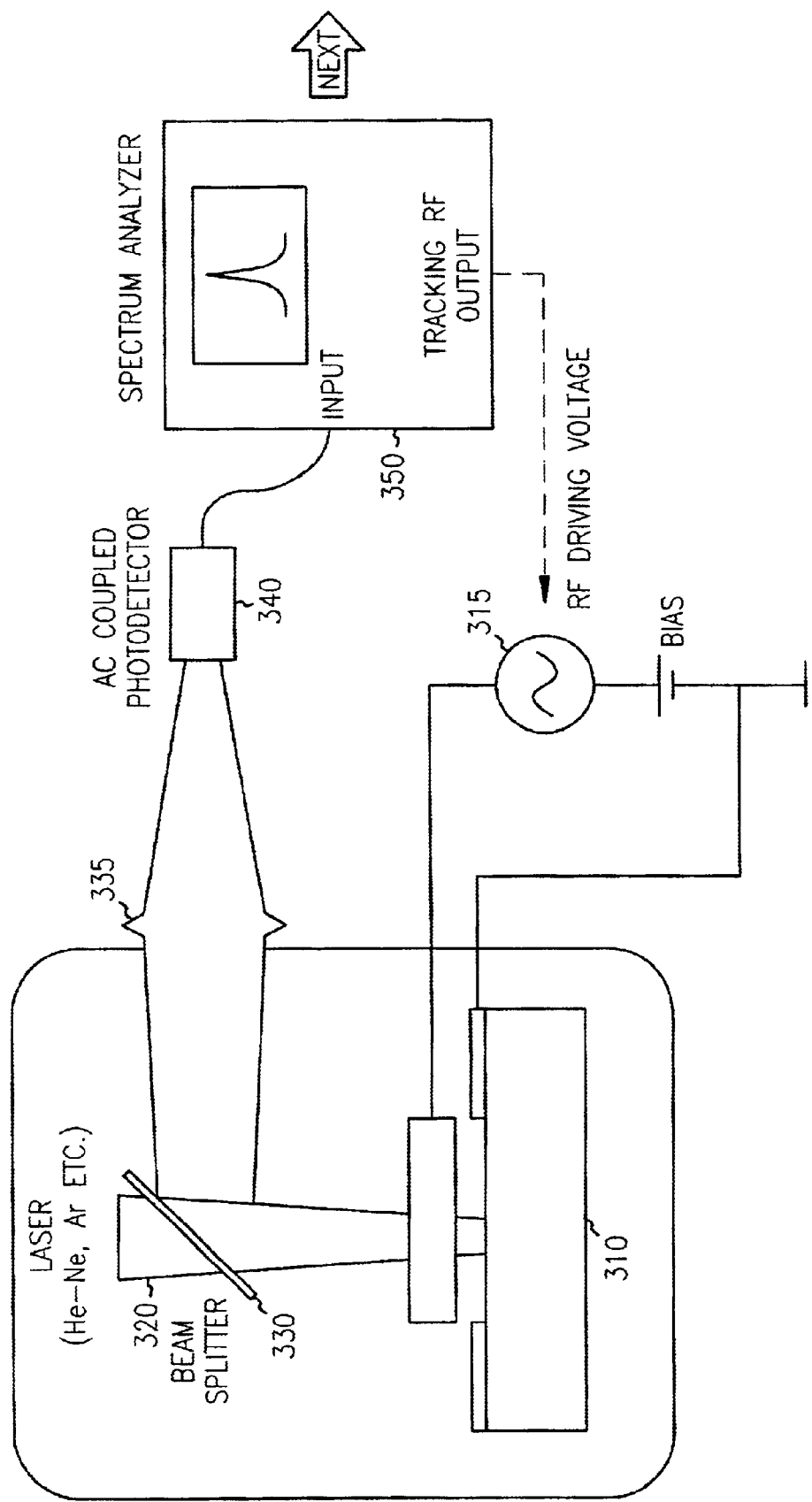
FIG. 3 is a block schematic diagram of a circuit for measuring mechanical motion of a parametric amplifier.

A simplified block diagram of an optical detection circuit is shown in FIG. 3. The first resonator is indicated at 310, and is driven by an input signal 315, which comprises a signal at approximately the resonating frequency of first resonator 310. The input signal 315, plus a desired bias voltage is provided to the first resonator.

A laser 320 positioned proximate the resonator, such as above it, provides a laser beam, that travels through a beam splitter 330 and focuses on a small portion of the resonator that moves, and reflects some of the light. An outer edge of a paddle, further away from any support beams, is used in one embodiment. Light is reflected back toward the beam splitter, and reflected by the splitter through an optional lens 335 to a photodetector or photoreceiver 340. The reflected light from the paddle is representative of the amount of mechanical movement of the paddle, and is provided to a spectrum analyzer or other output device 350. The spectrum analyzer is useful in modifying, or sweeping the second signal applied to a second resonator to determine an optimal frequency, which is close to the resonant frequency. This may vary from the resonant frequency of the second resonator.

In a linear approximation, the force between paddles is proportional to the angular position difference of the two resonators, and voltage difference squared. This coupling changes the effective restoring coefficient and serves as the equivalent of the time-varying capacitor used in electronic parametric amplifiers. In a further embodiment, mechanical motion of the resonators is converted to an electrical signal by capacitive coupling, or piezoelectric devices coupled to the resonators. The signal detected from either resonator may serve as the output signal depending on whether the device is used as an amplifier, or a frequency converter.

The resonator will have a Lorentzian response with improved effective Q-factor. It is an amplifier that also acts as a filter. Not only is it useful for amplifying small signals, but it also improves the stability of an oscillating system.

In one embodiment, structures are produced using electron beam lithography on silicon-on-insulator wafers consisting of 1 um-thick oxide buried underneath of 250 nm of single crystal (100) silicon. The devices are not metallized, but conductivity is obtained by wirebonding contact wires near the paddles. The devices are operated in a vacuum $10^{-4}$ Torr at room temperature. Mechanical motion is detected using optical interferometry. The motion of the structures modulates the reflected laser light, and is detected by an AC-coupled photoreceiver. The laser can be focused down to a few micron spot size, which allows observation of motion of a specific resonator. The frequency of the electrical driving signal is swept near resonance, and the mechanical response curves are measured. Peak amplitude and width are measured by fitting a Lorentzian to a response curve.

Conclusion

A nanomechanical parametric device, comprises two electrostatically coupled resonators, and operates using 3 frequencies (non-degenerate amplifier) to provide amplification or frequency conversion. The use of 3 frequencies eliminates phase sensitivity between the signal and pump voltage. The width of the response of the resonator is tuned by varying the pump voltage. The resonant frequencies of the individual oscillators are finely tuned by adjusting the bias voltages.

The device provides large phase-independent amplification of small mechanical motion. It is useable for improving the detection sensitivity of resonant mechanical sensors such as cantilever mass sensors, magnetic sensors, and others. Further configurations of resonators include end to end, vertical, many other way configurations such as small interdigitating fingers.

In further embodiments, the device is used for boosting received signals before further electronic processing, or for application in harsh environments unsuitable for regular electronics. It is also useful as a frequency converter. The device is also useful as a portion of a device selected from the group consisting of chemical sensors, magnetic sensors, electric field sensors, light sensors, atomic force microscopes, and thermal sensors to amplify their outputs. The amplifier also provides amplification of signals in cell phones, satellite communications, radars and radios.

What is claimed is:

1. A device comprising:
   a first mechanical torsional resonator; and
   a second mechanical torsional resonator electrostatically coupled to the first mechanical resonator wherein the electrostatic coupling is controlled by a voltage.

2. The device of claim 1 wherein the device acts as a frequency selective filter, a frequency converter or an amplifier.

3. The device of claim 1 wherein the device acts as a detector of applied force or a detector of mass collected on one of the resonators.

4. The device of claim 1 wherein the first and second resonators comprise oxide buried beneath single crystal silicon.

5. The device of claim 4 wherein the first and second resonators are approximately 1 um thick.

6. The device of claim 4 wherein the first and second resonators comprise paddles having wirebonded contact wires coupled thereto.

7. The device of claim 1 wherein the first and second resonators positioned in close proximity.

8. The device of claim 7 wherein the torsional resonators comprise paddles suspended by narrow beams.

9. The device of claim 1 and further comprising:
   a laser positioned to project light onto at least one of the mechanical resonators; and
   a photo receiver positioned to receive light reflected from the at least one of the mechanical resonators.

10. The device of claim 9 wherein the device provides amplification of signals in cell phones, from magnetic force imaging apparatus, satellite communication, radars and radios.

11. The device of claim 9 wherein the device comprises a portion of a device selected from the group consisting of chemical sensors, magnetic sensors, electric field sensors, light sensors, atomic force microscopes, and thermal sensors.

12. The device of claim 1 and further comprising means for sensing motion of a resonator.

13. The device of claim 12 wherein the means for sensing motion of a resonator senses such motion by detecting changes in capacitance.

14. A mechanical device comprising:
    a first mechanical resonator having a first resonant frequency;
    an input signal applied to the first resonator about the first resonant frequency;
    a second mechanical resonator electrostatically coupled to the first mechanical resonator, wherein the second mechanical resonator has a second resonant frequency; and
    a pump, coupled to the second mechanical resonator for providing a signal based on the sum of the input signal and a second signal close to the second resonant frequency.

15. The device of claim 14 and further comprising an optical detector that generates a signal representative of oscillation of the first resonator.

16. The device of claim 15 sand further comprising:
    a laser positioned to project light onto at least one of the mechanical resonators; and
    a photo receiver positioned to receive light reflected from the at least one of the mechanical resonators.

17. A method of processing an AC input signal, the method comprising:
    applying the input signal to a first mechanical resonator;
    applying the input signal and a second signal to a second mechanical resonator that is electrostatically coupled to the first mechanical resonator; and
    measuring movement of the first mechanical resonator.

18. The method of claim 17, wherein the second signal is approximately equal to a resonant frequency of the second mechanical resonator.

19. The method of claim 17 and further comprising sweeping the second signal about the resonant frequency of the second mechanical resonator to find a desired frequency for the second signal.

20. The method of claim 17 and further comprising modifying a resonator bias voltage.

21. The method of claim 17 and further comprising modifying a mechanical resonator to change its resonant frequency.

22. A device comprising:
    a first moveable mass;
    a second moveable mass electrostatically coupled to the first moveable mass; and
    a pump that modifies electrostatic interactions between the first and second moveable masses, wherein the first and second moveable masses comprise torsional resonators.

23. The device of claim 22 wherein the first and second moveable masses oscillate.

24. The device of claim 23 wherein the oscillation of the first and second moveable masses is parametric.

25. The device of claim 1 wherein the voltage comprises a voltage difference applied across the first and second mechanical resonators.

26. The device of claim 14 wherein the mechanical resonators are selected from the group consisting of cantilevers, double-supported beams, drum-like membranes, torsional and translational resonators.

* * * * *

UNITED STATES PATENT AND TRADEMARK OFFICE
CERTIFICATE OF CORRECTION

PATENT NO. : 6,900,575 B2
DATED : May 31, 2005
INVENTOR(S) : Olkhovets et al.

It is certified that error appears in the above-identified patent and that said Letters Patent is hereby corrected as shown below:

<u>Title page,</u>
Item [75], Inventor, delete "Jeeak" and insert -- Jeevak --, therefor.

Signed and Sealed this

First Day of November, 2005

JON W. DUDAS
*Director of the United States Patent and Trademark Office*